(12) United States Patent
Popek et al.

(10) Patent No.: US 11,509,255 B2
(45) Date of Patent: Nov. 22, 2022

(54) ELECTRIC MACHINE FAULT DETECTION SCHEME

(71) Applicant: Hamilton Sundstrand Corporation, Charlotte, NC (US)

(72) Inventors: Grzegorz Popek, Birmingham (GB); Stephen Minshull, Bromsgrove (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/008,881

(22) Filed: Sep. 1, 2020

(65) Prior Publication Data
US 2021/0175836 A1    Jun. 10, 2021

(30) Foreign Application Priority Data
Dec. 4, 2019 (EP) .................................. 19275139

(51) Int. Cl.
*H02P 29/028* (2016.01)
*G01R 31/34* (2020.01)

(52) U.S. Cl.
CPC .......... *H02P 29/028* (2013.01); *G01R 31/346* (2013.01)

(58) Field of Classification Search
CPC ...... H02P 29/028; H02P 6/183; H02P 29/024; G01R 31/346; G01R 31/52; H02H 7/0805
See application file for complete search history.

(56) References Cited

U.S. PATENT DOCUMENTS

| | | | |
|---|---|---|---|
| 7,592,772 B2 | 9/2009 | Nandi et al. | |
| 8,283,881 B2 * | 10/2012 | Gallegos-Lopez | ..... H02P 21/36 |
| | | | 318/400.21 |
| 8,913,353 B2 | 12/2014 | Gu et al. | |
| 8,947,028 B2 | 2/2015 | Gu et al. | |
| 9,018,881 B2 * | 4/2015 | Mao | ..... H02P 29/0241 |
| | | | 318/490 |
| 9,543,879 B2 | 1/2017 | Toliyat et al. | |
| 2015/0035469 A1 * | 2/2015 | Rozman | ..... H02P 6/183 |
| | | | 318/652 |
| 2015/0207446 A1 * | 7/2015 | Kakihara | ..... H02P 6/183 |
| | | | 318/400.33 |
| 2015/0270747 A1 | 9/2015 | Toliyat et al. | |
| 2016/0041228 A1 | 2/2016 | Gerada | |
| 2016/0285252 A1 * | 9/2016 | Burra | ..... H02J 3/381 |
| 2017/0102425 A1 | 4/2017 | Hao et al. | |

FOREIGN PATENT DOCUMENTS

| | | |
|---|---|---|
| CN | 101101319 A | 1/2008 |
| CN | 101221206 A | 7/2008 |
| CN | 106019073 B | 1/2019 |
| EP | 3480610 A1 | 5/2019 |

OTHER PUBLICATIONS

European Search Report for Application No. 19275139.4, dated Jun. 9, 2020, 19 pages.

* cited by examiner

*Primary Examiner* — Rina I Duda
(74) *Attorney, Agent, or Firm* — Cantor Colburn LLP

(57) ABSTRACT

A short circuit detection system and method that identifies a short circuit between turns of a winding of a permanent magnet machine having a three-phase winding in response to detection of imbalances between the three motor phases at an instant in time. The imbalances are identified by monitoring motor terminal voltages and currents.

8 Claims, 2 Drawing Sheets

ELECTRIC MACHINE FAULT DETECTION SCHEME

FOREIGN PRIORITY

This application claims priority to European Patent Application No. 19275139.4 filed Dec. 4, 2019, the entire contents of which is incorporated herein by reference.

TECHNICAL FIELD

This disclosure is concerned with detection of faults in permanent magnet synchronous machines (PMSM).

BACKGROUND

A permanent magnet synchronous machine generally includes a stator and a rotor which together define an air gap. The stator includes teeth which each have a radial tooth pole and an axially extending tooth head, whereby the tooth heads are arranged adjacent the air gap and neighbouring tooth heads in circumferential direction are spaced from one another by a slot. The rotor includes permanent magnets which are arranged in a flux concentration direction.

Permanent magnet machines are increasingly used in safety-critical systems such as in aerospace applications e.g. for landing gear, actuators, fuel pumps etc. in aircraft. Permanent magnet machines are particularly favoured in such applications because they offer high power density and high efficiency. A problem previously identified with permanent magnet machines is that the permanent magnet field cannot be de-excited in the event of a fault. Fault tolerant permanent magnet machines have therefore been developed which can detect faults and isolate faulty components and/or manage the system accordingly. Permanent magnet synchronous machines can be defined with two three-phase windings (i.e. with six phases). This 2×3 topology allows a level of fault tolerance since, if one set of windings fails, the system can continue to operate on the other set of windings. If the fault is due to short circuit between turns (i.e. an inter-turn short circuit) or at the motor terminals, the fault current can be reduced by short-circuiting the faulty phases using a driving inverter. In this way, the short circuit current is limited to a maximum of 1 per unit (PU) by the 1PU motor phase impedance. Failure to respond to a short circuit may lead to burn out of the motor phases where the short circuit occurs. It is, however, difficult to reliably detect an inter-turn short circuit so that the fault tolerance mechanism can be effected. Conventional systems identify an inter-turn short circuit by the winding burning out as the fault propagates through the winding.

The inventors have identified a need to quickly and reliably detect an inter-turn short circuit to quickly and reliably enable the fault tolerance features of the machine to be effected.

SUMMARY

The present disclosure provides a short circuit detection system and method that identifies a short circuit between turns of a winding of a permanent magnet machine having a three-phase winding in response to detection of imbalances between the three motor phases at an instant in time. The imbalances are identified by monitoring motor terminal voltages and currents.

In the preferred embodiment, different methods are used to identify imbalances depending on the motor speed. At zero to medium motor speeds, a high frequency signal is injected into the motor signal in the alpha-beta reference frame (described further below). Detection of a short circuit is made by measuring the D and Q current and performing a simple window comparison. At higher motor speeds, short circuit detection relies on measuring reference voltages, again as will be described further below.

DETAILED DESCRIPTION

Referring to the figures, an embodiment of the detection methodology will be described. This description is given by way of example only and variations may fall within the scope of the invention as defined by the claims.

Figure 1:
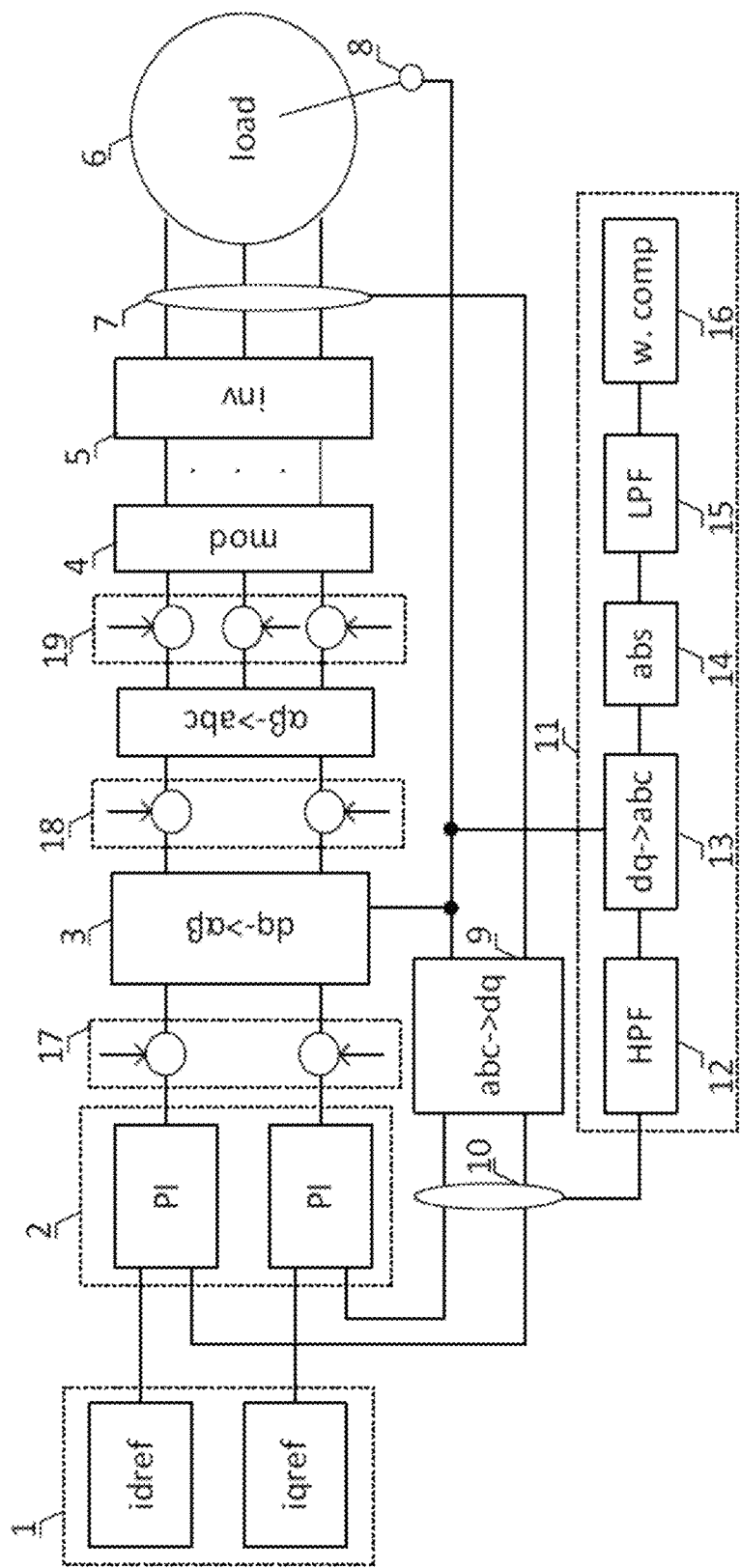
FIG. 1 is a schematic circuit diagram showing an example of the short circuit detection scheme according to an embodiment of the disclosure at lower speeds.
Figure 2:
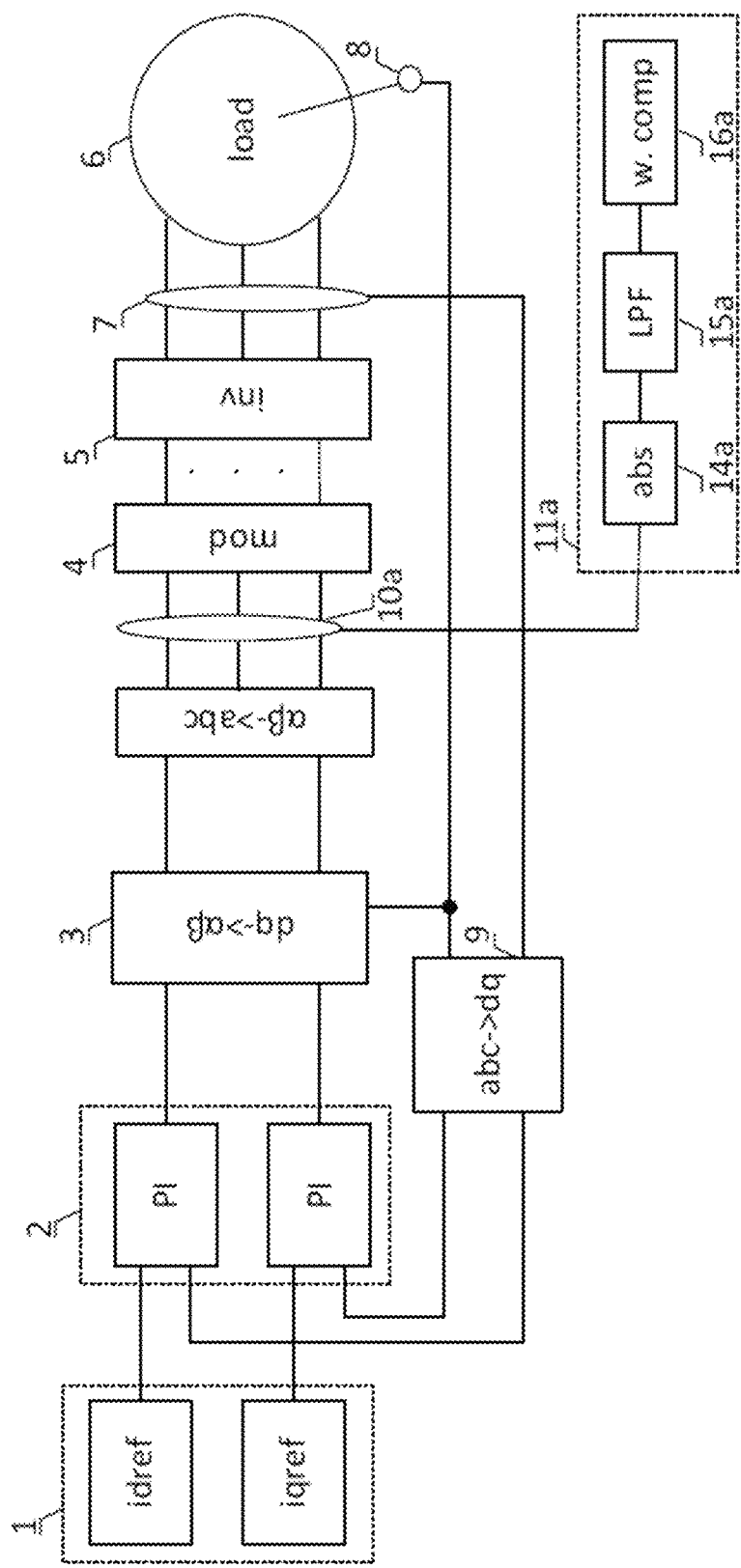
FIG. 2 is a schematic circuit diagram showing an example of the short circuit detection scheme according to an embodiment of the disclosure at higher speeds.

FIG. 1 shows the reference signals idref and iqref provided by a control unit (1) and the controller 2 that includes current loops PI of the PMSM which provide signals to drive the load (6). In a typical system, the signals are transformed from the dq frame to the alpha-beta ($\alpha\beta$) frame (3) and then into the abc frame. The abc frame signals are modulated (4) to control the inverter (5) before being supplied to the load (6). The speed and/or position of the motor load (6) is fed back (8), with measured motor currents (7) converted to dq reference frame (9) to control the PMSM in the known manner.

When the motor is at standstill or operating at low to medium speed, a small high frequency signal is injected into the alpha-beta command voltages (18). Alternatively, if correctly conditioned, the signal could be injected to the dq frame (17) or directly into the phase voltages (19). It is important that the size of the signal is kept small compared to the main motor excitation signals to prevent interference with the main motor control loop.

The frequency of the injected signal is selected to be greater than the bandwidth of the current loops of the controller (2). This prevents the controller 2 from seeing the injection as a disturbance and trying to counteract its effects.

Any inter-turn short circuit fault will result in an unbalanced high frequency current which can be detected in the d-q current feedback using a dedicated processing function (11). The detection processing function (11) may consist of a high-pass filter (12), an inverse Clark and Park transform that converts components in the orthogonal rotating reference frame (dq) to components in an orthogonal stationary frame ($\alpha\beta$) and then into components of a three-phase system (in abc frame) (13), an absolute function that removes the sign of the signal (14), a low pass filter (15) and a window comparator (16) that checks if all of the three-phase signals are within a certain band. In the event of an imbalance between the three phases where the three phase signals are not all within the band, an inter-turn short circuit is detected.

At medium to high motor speeds, an inter-turn short circuit, and a corresponding reduction in phase inductance, causes an imbalance to occur on the motor driving voltages. The closed loop current feedback controller (2) creates an imbalanced voltage since it counteracts for the imbalanced phase inductance caused by the short circuit. The imbalanced voltages are measured in the abc frame (10a) and are then processed using a detection algorithm (11a). The algorithm preferably consists of an absolute function that removes the sign of the signal (14a), a low pass filter (15a) and a window comparator (16a) which, as above, checks if all three phase signals are within a certain band. If not, the imbalance is an indication of a short circuit.

Because the movement of the rotor excites change in the motor voltages, there is no need, at higher speeds, to inject a signal, but this is needed at lower speeds.

Once a short-circuit is detected according to this disclosure, the fault tolerant mechanism described in the Background can be triggered—i.e. the faulty winding can be short-circuited in a known manner. Using the methodology of this disclosure allows faults to be detected sooner than previously.

The inter-turn detection algorithm of this disclosure is an enabling technology for existing fault-tolerant PMSM systems. The methodology makes use of hardware that is already available in typical motor controllers and no additional sensors are required. The scheme operates across the entire motor speed range from stall to high speed. At zero speed, the scheme can also be used as a diagnostic method for checking the health of the generator in the motoring mode.

The method can be implemented within e.g. a programmable logic or a microprocessor-type embedded controller.

The described embodiments are by way of example only. The scope of this disclosure is limited only by the claims.

The invention claimed is:

1. A method of detecting an inter-turn short-circuit in a winding of a multiple phase motor, being a multiple winding permanent magnet machine, the method comprising:
   detecting an imbalance between current and/or voltage of winding of a multiple phase motor, being a multiple winding permanent magnet machine; and
   determining a short-circuit in a winding of the machine based on detection of the imbalance;
   wherein at zero to medium motor speeds, the imbalance is detected by injecting a high frequency signal into a signal provided to drive the motor and determining a short-circuit is based on an imbalance in a feedback signal from the motor; and
   wherein at higher motor speeds determining a short-circuit based on the signal to drive the motor.

2. The method of claim 1, wherein the imbalance is detected in drive signals provided to the permanent magnet machine terminals at higher motor speeds.

3. The method of claim 1, wherein the imbalance is detected in feedback signals from the permanent magnet machine at zero to medium motor speeds.

4. The method of claim 1, wherein the high frequency signal is injected into command voltages in an alpha-beta frame.

5. The method of claim 1, wherein the high frequency signal is injected into voltages in a dq frame.

6. The method of claim 1, wherein the high frequency signal is injected directly into phase voltages at the motor terminals.

7. The method of claim 1, wherein a short-circuit is determined using a processing function comprising an absolute function, a low pass filter and a window comparator to determine whether all phase signals are within a given band, wherein if signals are outside the band, a short-circuit is determined.

8. The method of claim 1, wherein on determination of a short circuit in a winding, the winding is deactivated from operation of the permanent magnet machine.

* * * * *